United States Patent [19]

van Kessel et al.

[11] 4,023,099
[45] May 10, 1977

[54] CIRCUIT ARRANGEMENT FOR MEASURING THE EFFECTIVE VALUE OF AN ELECTRIC SIGNAL

[75] Inventors: Theodorus Jozef van Kessel; Eric Henricus Jozef Maria Stulemeijer, both of Eindhoven; Johannes Maria Pieper; Hendrikus Fransiscus Bonifatius Bloemen, both of Lelyweg, all of Netherlands

[73] Assignee: U.S. Philips Corporation, New York, N.Y.

[22] Filed: June 11, 1975

[21] Appl. No.: 585,834

[30] Foreign Application Priority Data

June 17, 1974 Netherlands .................... 7408033

[52] U.S. Cl. .................... 324/105; 324/106
[51] Int. Cl.² .................... G01R 5/22; G01R 19/02
[58] Field of Search .................... 324/105, 106, 95; 321/1.5

[56] References Cited

UNITED STATES PATENTS

| 2,857,569 | 10/1958 | Gilbert et al. | 324/106 |
| 3,624,525 | 11/1971 | Smith | 324/106 |

*Primary Examiner*—Rudolph V. Rolinec
*Assistant Examiner*—Ernest F. Karlsen
*Attorney, Agent, or Firm*—Frank R. Trifari; Bernard Franzblau

[57] ABSTRACT

A measuring arrangement for measuring the effective value of an a.c. signal. Said a.c. signal is applied to a first thermal convertor, while a d.c. output signal is applied to a second thermal convertor. The two thermal convertors differentially drive a differential amplifier, which at its outputs delivers the d.c. output signal. For values of the d.c. output signal which are smaller than a threshold value, a negative feedback signal which linearly depends on said d.c. output signal is applied via an additional negative-feedback network to at least one of the inputs of the differential amplifier. This facilitates zero-point adjustment, and also allows the measuring speed to be increased.

18 Claims, 10 Drawing Figures

CIRCUIT ARRANGEMENT FOR MEASURING THE EFFECTIVE VALUE OF AN ELECTRIC SIGNAL

The invention relates to a measuring arrangement for measuring the effective value of an electric a.c. signal. The arrangement includes a first energy-dissipating element to which the a.c. signal to be measured is applied. A first temperature-sensitive element, which is thermally coupled to said first energy-dissipating element, is included for converting the thermal energy produced by the first energy-dissipating element into a first electric signal. Also included are a second energy dissipating element and a second temperature-sensitive element, the latter element being thermally coupled to said second energy-dissipating element for converting the thermal energy produced by the second energy dissipating element into a second electric signal. The arrangement further comprises a differential amplifier with two inputs, to which the first and second electric signals are applied, and an output at which a d.c. output signal appears and is applied to the second energy-dissipating element.

The effective value of an electric a.c. signal may be derived from the d.c. signal which is capable of producing the same energy as said a.c. signal. In the measuring arrangements mentioned in the preamble, use is made of this data. To the second energy-dissipating element a d.c. signal is applied such that the power dissipated by said d.c. signal in said second energy dissipating element equals the power dissipated by the a.c. signal in the first energy-dissipating element. The desired d.c. signal is generated by the differential amplifier, which at its inputs receives the two signals which are produced by the temperature-sensitive elements, and which are thus proportional to the power dissipated in the two energy-dissipating elements. Consequently the differential amplifier produces a d.c. signal at its output such that its two input signals, and thus the power dissipated in the two energy-dissipating elements, are equal.

Such a measuring arrangement is known from U.S. Pat. No. 3,668,428. In the measuring arrangement described in said Patent the energy-dissipating elements consist of pure resistances and the temperature-sensitive elements are semiconductor junctions, for example two diodes or the base-emitter junctions of two transistors. Thus, use is made of the temperature dependence of the voltage-current characteristic of a semiconductor junction. However, it is equally possible to employ different temperature-sensitive elements, such as for example resistors with a negative temperature coefficient (NTC resistors).

This type of measuring arrangement essentially forms a negative feed back system. In the case of an increase of the a.c. signal which is applied to the first energy dissipating element, a difference signal is initially obtained at the input of the differential amplifier. As a result, the d.c. output signal increases so that the power dissipated in the second energy-dissipating element increases and the difference signal at the input of the differential amplifier decreases. The negative feedback thus produced has a quadratic dependence on the d.c. output signal because said negative feedback includes the conversion of said d.c. output signal into thermal energy. This means that the magnitude of the negative feedback factor depends on the magnitude of the d.c. output signal. This has a very adverse effect on the operation and reliability of the circuit arrangement.

First of all, said method of negative feedback substantially complicates the zero-point adjustment of the measuring arrangement. During said zero-point adjustment there is no measuring signal so that the d.c. output signal must also be zero. However, at said zero value of the d.c. output signal the negative feedback factor also equals zero, so that the measuring arrangement no longer receives any negative feeedback at all. This means that the zero-point adjustment, which is effected by balancing the two temperature sensitive elements, becomes highly critical because a small variation of the input difference signal of the differential amplifier manifests itself in an amplified form in the d.c. output signal via the amplifier, which now has no negative feedback.

A second problem, associated with the preceding problem, is constituted by the temperature drift of said zero point. As in this case the negative feedback is also substantially inoperative, said drift has a great influence on said d.c. output signal.

A third problem is that owing to the quadratic negative feedback, at a negative value of $V_O$, positive feedback will occur. Normally, this situation will not occur when an input a.c. signal is present. However, if no input signal is present, $V_O$ may in effect be negative owing to a deviation of the zero setting. In order to prevent the occurrence of positive feedback in such a case, which would result in instability of the measuring arrangement, a diode is generally included in the feedback path. Instability of the system is thus avoided, but for a negative $V_O$ there is no longer any feedback at all so that zero-point adjustment becomes even more difficult.

It is an object of the invention to provide a measuring arrangement which obviates the above-mentioned problems. The invention is therefore characterized in that a negative-feedback circuit is provided which, for values of the d.c. output signal smaller than a specific threshold value, supplies a negative feedback signal which, at least around the zero value, is linearly dependent on said d.c. output signal. The negative feedback signal is at least added to one of the two electric signals supplied by the temperature sensitive elements.

The step according to the invention ensures that at all times a negative feedback remains available which, in the case of small d.c. output signals is of course constituted substantially by said linear negative feedback alone. As a result, a far better zero adjustment can be achieved, while the effect of said temperature drift is reduced. As said linear negative feedback is symmetrical relative to $V_O = 0$, said zero-point adjustment is also independent of the polarity of the d.c. output signal. Moreover, it appears that owing to said additional negative feedback, the frequency response of the measuring arrangement can be improved in a simple manner so that an appreciably faster operation of the measuring arrangement can be obtained. Owing to the provision of said linear negative feedback it is obvious that for values of the d.c. output signal below said threshold value, measurement of the effective value of the measuring signal is no longer possible. However, it is not of the least significance because owing to a change-over of the measuring range, said effective value will always be read at the highest possible scale-deflection of the indicating instrument, and not at said extreme position, for example smaller than 10% of full-scale deflection.

Said linear negative feedback can be achieved in various ways. In a first preferred embodiment said negative-feedback circuit consists of a first and a second voltage divider chain, each having a tapping terminal and a clamping circuit for clamping the output signal at the respective tapping terminal to a specific clamping value which is common for the two divider chains. However the linear relationship between the output signals at the two tapping terminals and the d.c. output signal applied to the two voltage divider chains is different, and the difference of the two output signals is employed as the desired negative feedback signal.

In the case, where two transistors, connected as a differential pair, are used as the temperature-sensitive elements, it is possible, according to a further preferred embodiment, to form the difference of the two output signals of the voltage divider chains by individually applying said output signals to the control electrodes of said transistors.

Owing to the presence of the linear negative feedback the measuring arrangement is capable of very rapidly providing an accurate measuring value, for which purpose the transfer characteristic of the differential amplifier exhibits a constant frequency-independent gain value between a first and a second frequency limit, and a part with a negative slope below the first frequency limit. The first frequency limit has a value such that the reciprocal of the negative feedback factor corresponding to said frequency, which occurs at the threshold value of the d.c. output signal, is smaller than said gain value. The second frequency limit has a value such that the reciprocal of the negative corresponding to said frequency, which occurs at the maximum permissible value of the d.c. output signal, is greater than said gain value.

The invention will now be described in more detail with reference to the figures, in which.

Figure 3:
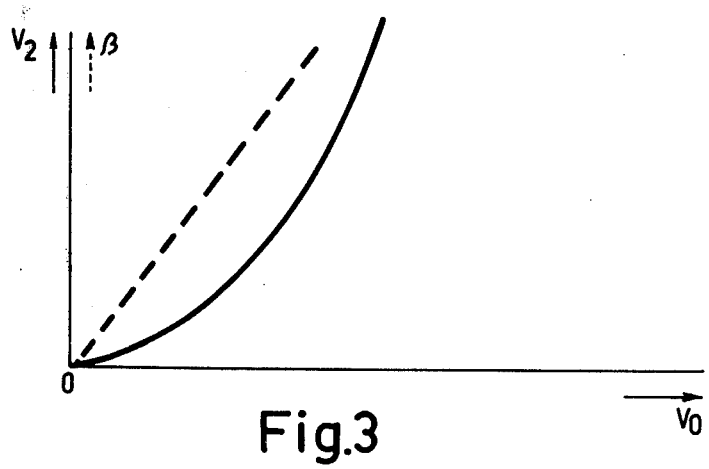
Figure 4:
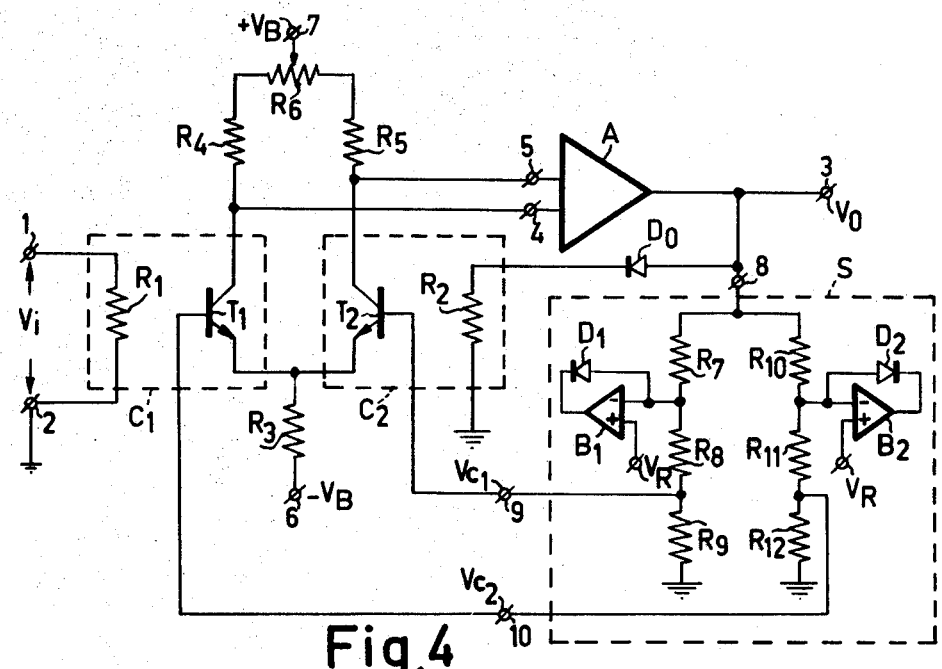
Figure 5:
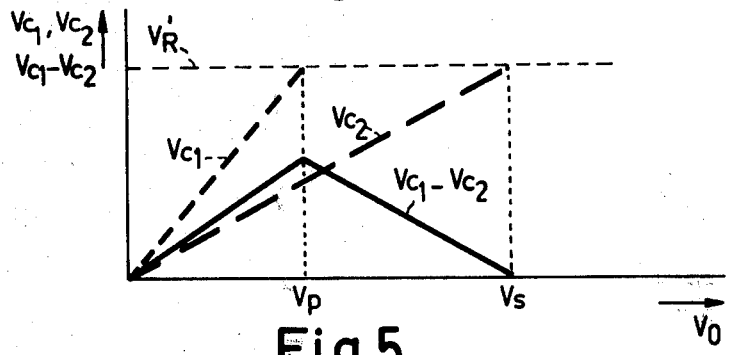
Figure 8:
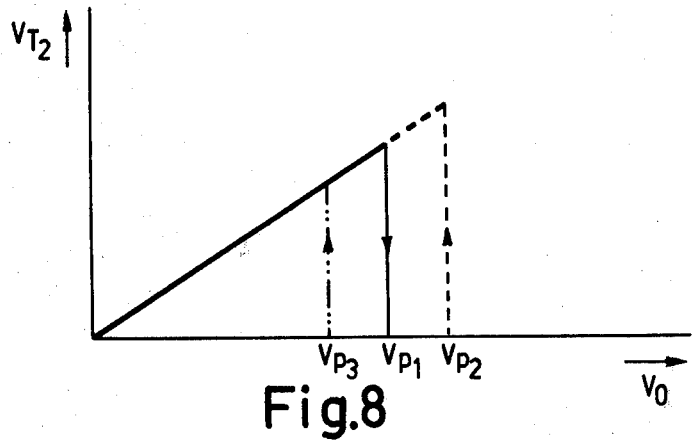
Figure 6:
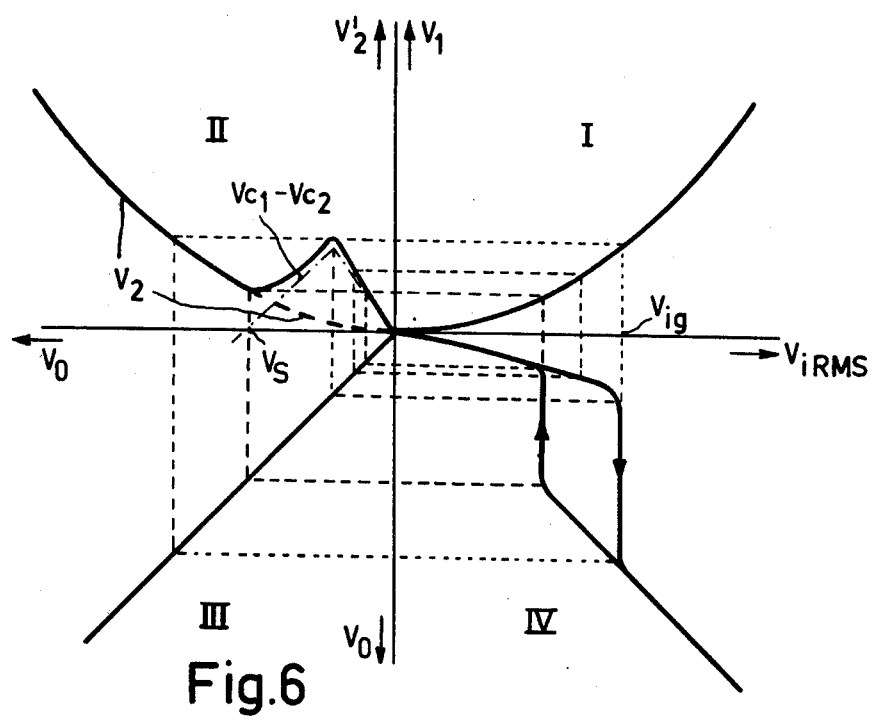
Figure 7:
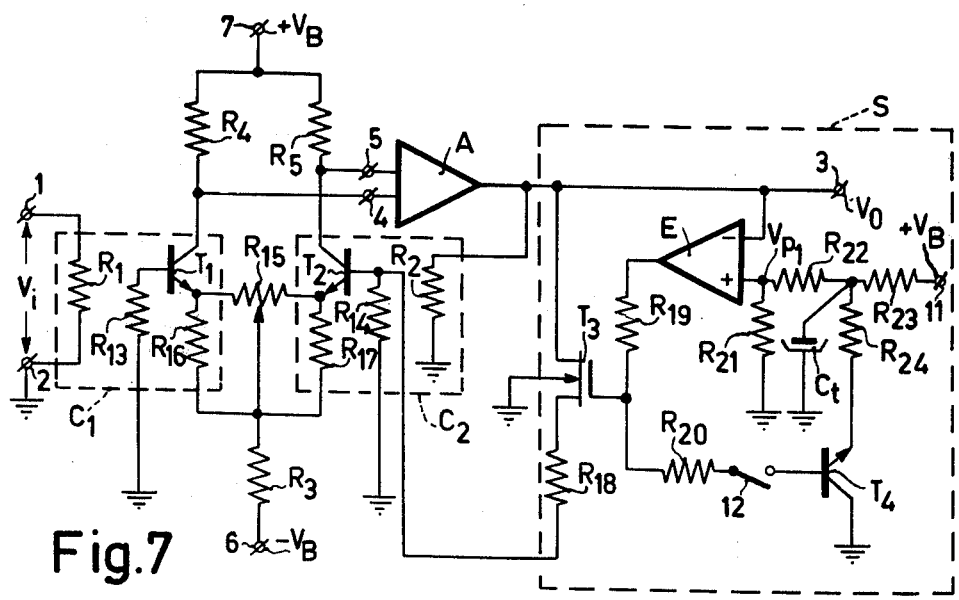
Figure 9:
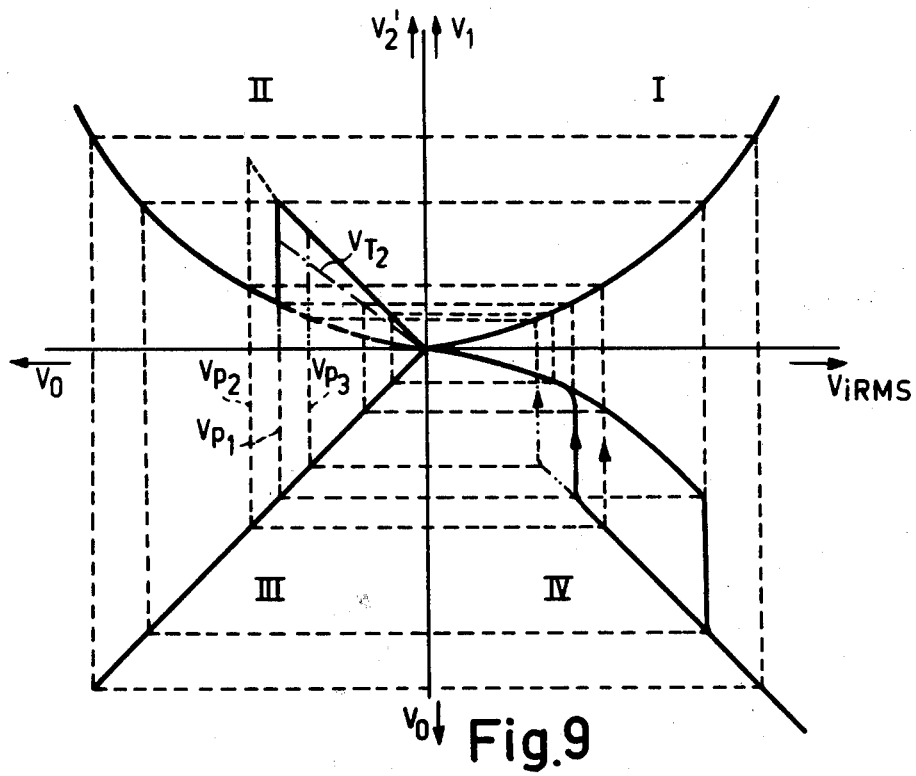
Figure 10:
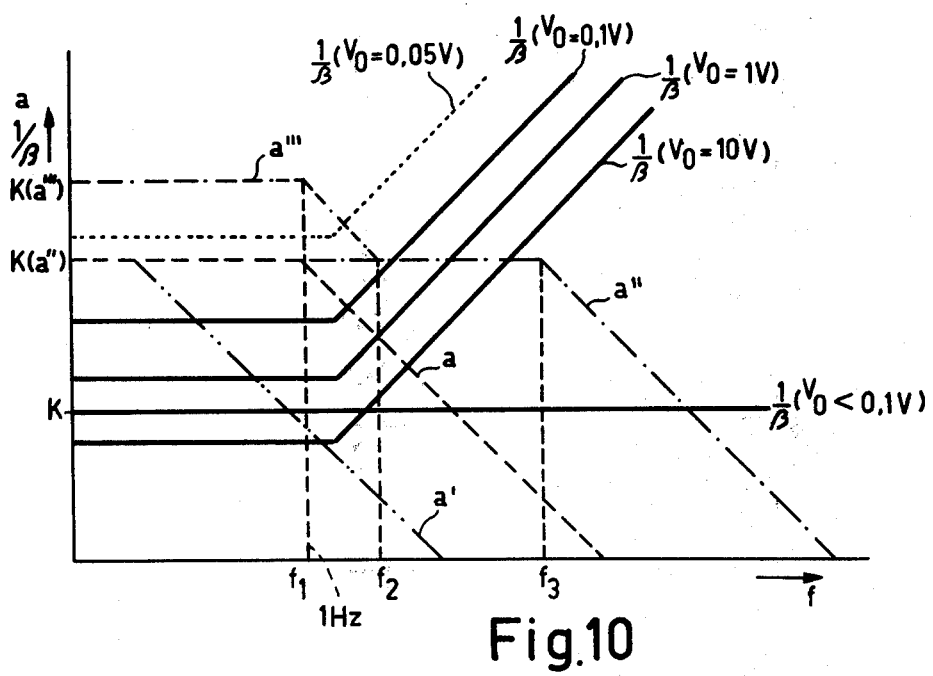

FIG. 3 shows the characteristic of the negative-feedback newtwork which is then operative, FIG. 4 shows a first embodiment of the measuring arrangement according to the invention, and FIGS. 5 and 6 show the associated characteristics, FIG. 7 shows a second embodiment of the measuring arrangement according to the invention, FIGS. 8 and 9 show the associated characteristics, and FIG. 10, for the purpose of illustration, finally shows the frequency response of the measuring arrangement according to the invention.

Figure 1:
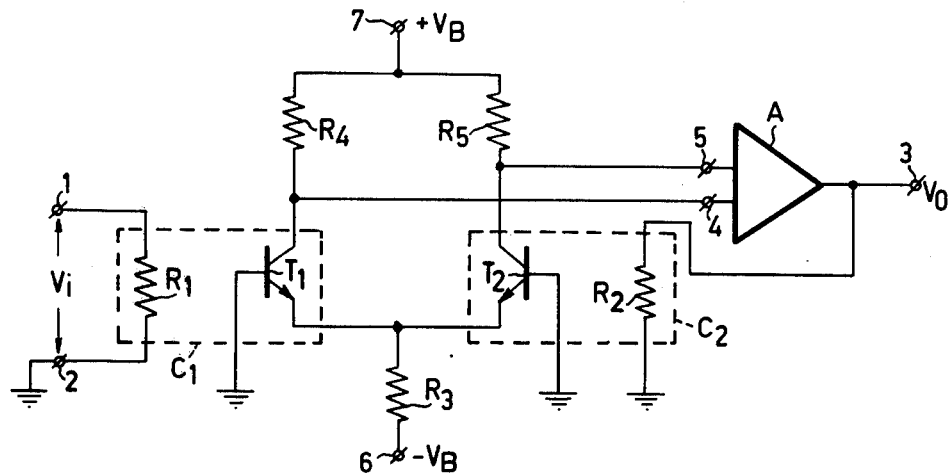
FIG. 1 shows a known measuring arrangement.

The known measuring arrangement shown in FIG. 1 first of all comprises a resistor $R_1$ and a transistor $T_1$ which are thermally coupled since they are disposed on a common wafer $C_1$ of a thermally highly conducting material. In a similar manner a resistor $R_2$ and a transistor $T_2$ are disposed on a common wafer $C_2$ of a thermally highly conducting material. The two transistors are connected as a differential pair, their base electrodes being connected to ground potential and their emitters, via a common emitter resistor $R_3$, to a terminal 6, to which the negative supply voltage $-V_B$ is applied. The collectors of these two transistors $T_1$ and $T_2$ are connected via individual resistors $R_4$ and $R_5$ to a terminal 7, to which the positive supply voltage $+V_B$ is applied. The voltages appearing across these two resistors $R_4$ and $R_5$ are applied to the two input terminals 4 and 5 of a differential amplifier A, which at an output terminal 3 produces a d.c. output signal $V_O$. This d.c. signal $V_O$ is further applied to one end of the resistor $R_2$, whose other end is connected to ground potential. The signal to be measured $V_i$ is applied between the two ends 1 and 2 of the resistor $R_1$, the end 2 also being connected to ground potential.

When an a.c. signal $V_i$ is applied to the resistor $R_1$, a specific thermal energy is dissipated in said resistor so that the temperature of the wafer $C_1$ will increase. As a result, the current through the transistor $T_1$ changes because the relationship between the collector current and the base-emitter voltage of a transistor is temperature-dependent. Owing to said change of the collector current of transistor $T_1$ a difference signal is obtained at the input of the differential amplifier A. This signal is amplified and is available at the terminal 3 as a d.c. output signal $V_O$. Said d.c signal $V_O$ is also applied to the resistor $R_2$ so that, in said resistor, a specific thermal energy also is dissipated, which results in an increase of the temperature of the wafer $C_2$. As a result, the collector current of transistor $T_2$ also increases so that the difference signal at the output of the amplifier A decreases. The condition of equilibrium is obtained when the two wafers $C_1$ and $C_2$ have the same temperature. Since in that case the input signal $V_i$ and the d.c. output signal $V_O$ produce the same thermal energy in the resistors $R_1$ and $R_2$, the said d.c. output signal $V_O$ is a measure of the effective value of said a.c. signal $V_i$. Of course, it is assumed that both the resistors $R_1$ and $R_2$, as well as the transistors $T_1$ and $T_2$, are highly identical, i.e. closely matched, and, moreover, that the differential amplifier A has an infinitely high gain factor.

Figure 2:
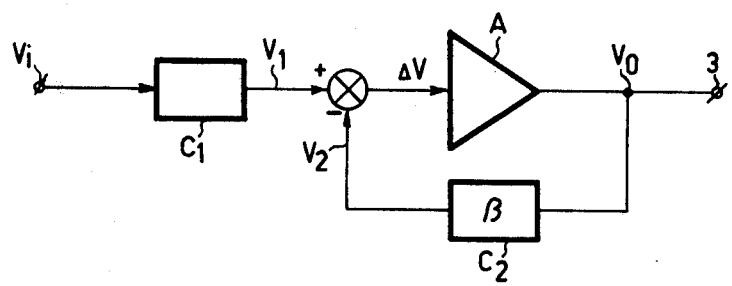
FIG. 2 shows the associated block diagram.

To clarify the behaviour of the measuring arrangement, FIG. 2 again shows said measuring arrangement in block-schematic form. The block $C_1$ corresponds to the conversion of the input a.c. signal $V_i$ into thermal energy and subsequently the conversion of said thermal energy into an electric voltage $V_1$. The block $C_2$, with the transfer function $\beta$, similarly represents the conversion of the d.c. output signal $V_O$ into thermal energy and subsequently into an electric voltage $V_2$. Subsequently, the difference $\Delta V$ between these two voltages $V_1$ and $V_2$ is determined and amplified with the aid of the amplifier A.

$V_1$ may be written as $$V_1 = K_1 (V^2 iRMS/R_1) \tag{1}$$

$V_{iRMS}$ being the effective value (RMS-value) of the a.c. signal $V_i$, and $K_1$ a constant. $V_2$ may be written as $$V_2 = K_2 (V^2O/R_2) \tag{2}$$

in which $K_2$ is again a constant. For the transfer function of the system it is then found that $$V_O = a\Delta V = a(V_1 - V_2) = a\left(\frac{K_1}{R_1} V^2_{iRMS} - \frac{K_2}{R_2} V^2_O\right) \tag{3}$$

where $a$ is the gain factor of the amplifier A. This yields $$V_O = -\frac{R_2}{2aK_2} + \sqrt{\frac{R_2^2}{4a^2K_2^2} + \frac{R_2 K_1}{R_1 K_2} V^2_{iRMS}} \tag{4}$$

When $a$ is infinitely high, it follows that $$V_O = \sqrt{\frac{R_2 K_1}{R_1 K_2}} \cdot V_{iRMS} \quad (5)$$

which, if $K_1 = K_2$ and $R_1 = R_2$ yields the desired result $$V_O = V_{iRMS} \quad (6)$$

From equation (2) it follows that the negative feedback voltage is a quadratic function of the d.c. output signal $V_O$, which function is represented in FIG. 3. This means that the transfer function $\beta$ of the negative feedback network $C_2$ depends on $V_O$, viz.

$$\beta = \frac{dV_2}{dV_O} = \frac{2K_2}{R_2} V_O \quad (7)$$

which is represented by the dashed line in FIG. 3. However, this means that at small values of the output signal $V_O$ there is substantially no negative feedback.

This is particularly disturbing when the zero point of the measuring arrangement is adjusted, when this very situation occurs. Said zero point adjustment is generally effected by balancing the differential stage formed by the transistors $T_1$ and $T_2$, for example by not connecting the terminal 7 (FIG. 1) directly to the resistors $R_4$ and $R_5$, but to the wiper of a potentiometer whose terminals are connected to said resistors. By moving said wiper a difference voltage is introduced at the input of the amplifier A, which compensates for the effect of possible inequalities of resistors and transistors. However, as the amplifier A now receives virtually no negative feedback a small variation of $\Delta$ at the input of the amplifier results in a large variation of the output signal $V_O$, so that the zero-point adjustment is very critical. Furthermore, a temperature drift in the wafers $C_1$ and $C_2$ will also result in a substantial variation of said zero point setting because this temperature drift also causes a difference voltage at the amplifier A, which at that instant receives virtually no negative feedback.

FIG. 4 shows a first embodiment of the measuring arrangement according to the invention, corresponding elements being designated by the same reference letters and numerals as in the circuit arrangement of FIG. 1. The measuring arrangement is fully identical to that of FIG. 1. For illustration only the zero-point adjustment potentiometer $R_6$ is shown. The terminals of $R_6$ are connected to the resistors $R_4$ and $R_5$ and its wiper is connected to the terminal 7. However, the measuring arrangement now includes an additional negative feedback network S.

The negative feedback network S comprises an input terminal 8 to which the d.c. output signal $V_O$ is applied. Said input terminal 8 constitutes one end of the two voltage divider chains including the resistors $R_7$, $R_8$, $R_9$ and $R_{10}$, $R_{11}$, $R_{12}$ respectively, the other end of each of which is connected to ground potential. The connection point between the resistors $R_7$ and $R_8$ is connected to the inverter input of an operational amplifier $B_1$, whose non-inverting input is connected to a reference voltage $V_R$. The inverting input and the output are coupled via a diode $D_1$. Similarly, the connection point of the resistors $R_{10}$ and $R_{11}$ is connected to the inverter input of an operational amplifier $B_2$, which is shunted by a diode $D_2$ and which, at its non-inverting input, receives the reference voltage $V_R$. The connection point of the resistors $R_8$ and $R_9$ constitutes a first output terminal 9 of the negative-feedback network S and the connection point of the resistors $R_{11}$ and $R_{12}$ forms a second output terminal 10.

The operation of said negative feedback network S will be described with reference to FIG. 5. Upon an increase of the voltage $V_O$, both the voltage $V_{c_1}$ at the terminal 9 and the voltage $V_{c_2}$ at the terminal 10 will increase linearly with $V_O$. The slope of this increase obviously depends on the choice of the resistors in the two voltage divider chains. When the voltage $V_O$ has increased to a value $V_p$ such that the voltage at the connection point of the resistors $R_7$ and $R_8$ equals the reference voltage $V_R$, a further increase of the voltage $V_O$ will no longer have any effect on the voltages in said voltage divider chain. The voltage at this connection point of the resistors $R_7$ and $R_8$ is then clamped at said reference voltage $V_R$ with the aid of the operational amplifier, so that the voltage $V_{c_1}$ at the output terminal 9 then remains equal to $$V_{R'} = \frac{R_9}{R_8 + R_9} V_R \quad (8)$$

When the voltage $V_O$ further increases the value $V_s$ while the voltage at the connection point of the resistors $R_{10}$ and $R_{11}$ becomes equal to the reference voltage $V_R$, a further increase of said voltage $V_O$ also will not have any effect on the voltages in said voltage divider chain. The voltage at the output terminal 10 then remains $$V_{c_2} = \frac{R_{12}}{R_{11} + R_{12}} V_R \quad (9)$$

For
$$\frac{R_9}{R_8 + R_9} = \frac{R_{12}}{R_{11} + R_{12}}$$

it follows in that case that $$V_{c_2} = V_{R'} \quad (10)$$

The voltages at the two output terminals 9 and 10 are then clamped at the same value $V_{R'}$.

The two operational amplifiers $B_1$ and $B_2$ thus effect a clamping of the output voltages $V_{c_1}$ and $V_{c_2}$ at terminals 9 and 10 of the two voltage divider chains. It is obvious that for this purpose it is alternatively possible to make the clamping circuits directly act on said terminals 9 and 10. The configuration which is shown has been selected because in this case the clamping circuit can operate with a higher clamping voltage then the clamping voltage which is ultimately required at the terminals 9 and 10.

In order to obtain a suitable negative feedback signal, the difference signal $V_{c_1} - V_{c_2}$ has to be generated which varies as represented by the continuous line in FIG. 5. This difference signal can, of course, also be obtained with the aid of a differential amplifier whose single-ended output signal should then be applied to the base of transistor $T_2$. However, as the two transistors $T_1$ and $T_2$ themselves constitute a differential amplifier configuration, the output signals $V_{c_1}$ and $V_{c_2}$ may be applied directly to the base electrodes of said two transistors.

The effect of said additional negative feedback is most suitably illustrated with the aid of the characteristics shown in FIG. 6. Said Figure (see characteristic I) first of all shows the quadratic relationship between the effective value $V_{iRMS}$ of the input signal $V_i$ and the voltage $V_1$ resulting therefrom for the amplifier A. (see FIG. 2). The characteristic II shows the relationship between the output voltage $V_O$ and the overall negative feedback signal $V_2$. This negative feedback signal consists of a component $V_2$ (see FIGS. 2 and 3) which is a quadratic function of $V_O$, plus a component $V_{c_1} - V_{c_2}$ which is caused by the additional negative feedback circuit S.

The overall negative feedback signal $V_2'$ consequently exhibits the variation represented by the continuous line in said characteristic II. This reveals that for output signals $V_O < V_S$ the negative feedback signal is mainly determined by $V_{c_1} - V_{c_2}$ whereas for $V_O > V_S$ only the quadratic negative feedback $V_2$ is effective. In contradistinction to the original quadratic negative feedback $V_2$, the negative feedback which is now effective at $V_O = O$ no longer has a slope equal to zero, but rather has the slope of the $V_{c_1} - V_{c_2}$ characteristic. This means that there is also an effective negative feedback around $V_O = O$ so that the zero point adjustment of the measuring arrangement may proceed in a much simpler and more accurate manner. When a diode $D_O$ (FIG. 4) is connected in the quadratic negative feedback circuit in order to prevent positive feedback in the case of a negative $V_O$, zero-point adjustment can nevertheless be effected independently of the polarity of $V_O$ because the linear negative feedback remains effective independent of this polarity.

From the two characteristics I and II a characteristic IV may be derived in a simple manner with the aid of the auxiliary characteristic III. The characterstic IV represents the relationship between the effective value $V_{iRMS}$ of the input signal and the output voltage $V_O$. This reveals that as a result of the additional negative feedback a hysteresis function is obtained. The measurement of the effective value of an input signal should therefore be performed in the part of the characteristic beyond said hysteresis function, i.e. $V_{iRMs}$ must be $> V_{ig}$. It is evident that said requirement can always be met by changing over the measuring range of the measuring apparatus, i.e. by adaptation of a measuring amplifier which precedes the actual measuring arrangement, which adaptation of the measuring range is generally effected automatically. In order to ensure that the range of the indicating instrument of the measuring apparatus is sufficiently large for convenient reading, it is therefore necessary to select the extreme value $V_S$ of the output voltage $V_O$ at which the additional negative feedback is still effective to be comparatively small (for example 1%) relative to the maximum value (full-scale value of the reading instrument) of said output voltage $V_O$.

It is evident that the desired characteristic for the additional negative feedback can be obtained by selection of the resistors in the two voltage divider chains. For example, when there are selected so that $R_8 = R_{11}$ and $R_9 = R_{12}$, the requirement that the same $V_R$ (FIG. 5) should obtain for both voltage divider chains is automatically met. The resistors $R_7$ and $R_{10}$ then determine the difference between the slopes of the characteristics $V_{c_1}$ and $V_{c_2}$, while $R_7$ should consequently be smaller than $R_{10}$. Of course, various modifications are conceivable to realize the desired characteristic $V_{c_1} - V_{c_2}$. Many modifications are also possible in respect of the clamping circuits $B_1$, $D_1$ and $B_2$, $D_2$.

FIG. 7 shows a second embodiment of the measuring arrangement according to the invention. Except for the additional negative feedback network, the design of the measuring arrangement is substantially the same as that of FIG. 4. However, for the purpose of illustration, a balancing circuit is now included in the emitter circuits of the two transistors $T_1$ and $T_2$, which balancing circuit comprises a potentiometer 15 connected between the emitters of the two transistors $T_1$ and $T_2$ and two individual emitter resistors $R_{16}$ and $R_{17}$. The connection point of said emitter resistors $R_{16}$ and $R_{17}$ is connected to the wiper of the potentiometer $R_{15}$ so that, by moving said wiper, the desired zero point adjustment can be obtained.

The negative feedback network S now comprises an operational amplifier E whose inverting input receives the output voltage $V_O$ and whose non-inverting input receives a reference voltage $V_{p_1}$. The reference voltage is derived with the aid of the resistors $R_{21}$, $R_{22}$ and $R_{23}$ from the supply voltage $+V_B$, which is applied to the terminal 11. The output of said operational amplifier E is connected via a resistor $R_{19}$ to the control electrode of a field-effect transistor $T_3$ which functions as a switch. Said field-effect transistor $T_3$ is connected to the output terminal 3 by one of its main electrodes, while the other main electrode via the series connection of the resistors $R_{18}$ and $R_{14}$ to ground potential. The connection point of the resistors $R_{14}$ and $R_{18}$ is connected to the base of transistor $T_2$.

When the output voltage $V_O$ is smaller than the reference voltage $V_{p_1}$, the output voltage of the operational amplifier E keeps the transistor $T_3$ conducting so that, via said transistor and the resistors $R_{18}$ and $R_{14}$, a negative feedback is applied which varies linearly with the output voltage $V_O$. When the output voltage becomes greater than the reference voltage $V_{p_1}$, transistor $T_3$ cuts off and said linear negative feedback is discontinued. The variation of the negative feedback voltage at the base of transistor $T_2$ as a function of the output voltage $V_O$ is represented in FIG. 8 (continuous line), while FIG. 9 (continuous lines), analogous to FIG. 6, shows the resulting characteristics of the measuring arrangement. This reveals again that the $V_{iRMS}$ vs. $V_O$ characteristic exhibits a hysteresis, The magnitude of said hysteresis loop may be varied with the aid of an additional controlled switch in the negative feedback network S. In FIG. 7 said additional switch, by way of example, is constituted by a transistor $T_4$ whose collector is connected to ground potential and whose emitter is connected via a resistor $R_{24}$ to the connection point of the resistors $R_{22}$ and $R_{23}$. Via a switch 12, which merely serves for illustration and is now continuously closed, and a resistor $R_{20}$, the base $T_4$ receives the same control signal as the control electrode of transistor $T_3$. Furthermore, a capacitor $C_t$ is now included between the connection point of the resistors $R_{22}$ and $R_{23}$ and ground.

The operation of the arrangement is now as follows. As long as the control voltage at the control electrode of transistor $T_3$ is positive, transistor $T_4$ is conducting and the circuit including the resistor $R_{24}$ and said transistor $T_4$ contributes to the reference voltage at the non-inverting input of the operational amplifier E. If it is assumed that in this situation said reference voltage again equals $V_{p_1}$, the linear negative feedback will be present for $V_O < V_{p_1}$, which feedback is discontinued as soon as $V_O$ becomes greater than $V_{p_1}$, which consequently results in the continuous characteristic of FIG. 8. However, as soon as $V_O$ exceeds $V_{p_1}$, transistor $T_4$ is cut off in addition to transistor $T_3$. As a result, the reference voltage at the non-inverting input of the operational amplifier E will assume a higher value, for example $V_{p_2}$. The new reference value $V_{p_2}$ should of course be smaller than the new value of $V_O$ obtained as a result of the cancellation of the linear negative feedback. Moreover, care must be taken that when the output voltage $V_O$ exceeds the threshold value $V_{p_1}$, the increase of $V_O$, which then occurs to the value which corresponds to the system then operating with quadratic negative feedback only, takes place more rapidly than the change-over of the reference voltage from the value $V_{p_1}$ to the value $V_{p_2}$, because otherwise the linear negative feedback would be switched on and off continually. For this purpose the capacitor $C_t$ is included, which ensures that the time constant with which the reference voltage is switched over is greater than the time constant with which the output voltage increases. When $V_O$ now decreases again, the linear negative feedback will be applied again when $V_O$ becomes smaller than $V_{p_2}$, so that for decreasing $V_O$ the dashed characteristics in FIGS. 8 and 9 are valid. These Figures show that owing to said step the hysteresis loop in the $V_{iRMS}$ $V_s$. $V_O$ characteristic is reduced. Owing to this change-over of the reference voltage from a value $V_{p_1}$ to a higher value reference voltage $V_{p_2}$ it is achieved that for decreasing $V_O$ the change-over to the linear negative feedback will take place at a higher value of the input signal $V_{iRMS}$ than in the case where the reference voltage is not changed over, which may contribute to an unambiguous and reliable change-over. For the purpose of illustration the dash-dot-dot lines in the two figures also represent a situation in which, upon cancellation of the linear negative feedback, a smaller reference voltage $V_{p_3}$ becomes effective. In that case the hysteresis loop in the $V_{iRMS}$ $V_s$. $V_O$ characteristic increases. It will be evident that changing over of the reference values can be effected in several ways which are obvious to those skilled in the art.

Owing to the application of the additional linear negative feedback at small values of the d.c. output signal $V_O$, a very rapid and accurate operation of the measuring arrangement can be obtained, i.e. an accurate measuring result can be read after a very short time interval upon application of an input signal, which will be explained with reference to the characteristics shown in FIG. 10. In FIG. 10 the frequency response curve of the amplifier A and of the reciprocal negative feedback function $1/\beta$ (see FIG. 2) is plotted, which suffices to consider the stability of the measuring system. For the transfer function of the negative-feedback system of FIG. 2, it is true that $$V_o = a(V_1 - V_2) = a(V_1 - \beta V_o) \tag{11}$$

which for the transfer function yields $$\frac{V_o}{V_1} = \frac{1}{\frac{1}{a} + \beta} \tag{12}$$

The frequency response curve of the amplifier A normally consists of a flat part, which above a certain frequency limit of for example 1 Hz changes into a falling characteristic with a slope of −6 dB/oct., as is indicated by the dashed line in FIG. 10. The negative feedback factor $\beta$ depends on the magnitude of the output voltage $V_o$ (see formula 7). The value of this negative feedback factor given in formula (7) should moreover allow for a time constant, which is caused by the thermal capacity and thermal leakage to the environment surrounding the wafer $C_2$. Therefore, $\beta$ may be written as $$\beta = \frac{2K_2}{R_2} V_o \cdot \frac{1}{1 + j\omega\tau} \tag{10}$$

The $1/\beta$ characteristic consequently also has a flat portion, which above a specific frequency limit changes into a rising characteristic with a slope of +6 dB/oct. It appears that in practical embodiments said frequency limit of the $1/\beta$ characteristic may also lie near 1 Hz, which is of course determined by the thermal capacity and the heat transfer of the materials which are used. For $1/\beta$ a family of characteristics is obtained with the output voltage $V_O$ as a parameter. It is assumed that the maximum output voltage is 10 V (full-scale deflection), so that the family of characteristics is limited towards the lower values by the characteristic $1/\beta$ ($V_O = 10$ V). When it is further assumed that the additional linear negative feedback becomes effective for $V_O < 0.1$ V, the family of characteristics is also limited towards the higher amplitude values owing to said step according to the invention, namely by the characteristic $1/\beta$ ($V_O = 0.1$ V). For $V_O < 0.1$ V said linear negative feedback will become effective and will dominate over the quadratic negative feedback, so that the $1/\beta$ characteristic is then straight and, for example, has a constant value K. Furthermore, the $1/\beta$ ($V_O = 1$ V) characteristic is shown for illustration purposes, which characteristic is situated between the limiting characteristics $1/\beta$ ($V_O = 0.1$ V) and $1/\beta$ ($V_O = 10$ V).

The figure shows that the gain characteristic a of the amplifier and the characteristics $1/\beta$ intersect each other at an angle which corresponds to a slope of 12 dB/oct. However, this simplies that the system is unstable because the denominator of formula (9) then becomes zero, and hence $V_0/V_1$ infinitely great. An obvious step to solve said problem is to adapt the amplifier characteristic in accordance with the dash-dot-dot line $a'$. Said characteristic $a'$ has a falling slope which, relative to that of the characteristic a, has shifted so far towards the lower frequency values that the intersection with the $1/\beta$ ($V_O = 10$ V) characteristic lies below the break point of said $1/\beta$ characteristic. This characteristic $a'$ and the $1/\beta$ characteristics intersect each other at an angle of 6 dB/oct. so that the system is stable. However, owing to said adaptation of the amplifier characteristic the system has become inert. The points of intersection of the amplifier characteristic and the $1/\beta$ characteristic, which eventually constitute the break-points of the overall transfer charactersitic of the negative feedback system, and thus determine the measuring speed, have now shifted towards the lower frequency values.

A possibility of stabilizing the system without causing a slower operation would be to adapt the amplifier characteristic in accordance with the dash-dot line $a''$. For this a very-wide-band amplifier must be realized with a flat characteristic up to the frequency $f_3$, which is higher than the frequency value of the point of intersection with the $1/\beta$ ($V_O = 10$ V) characteristic. The figure shows that the points of intersection of the $1/\beta$ and the $a''$ characteristics are situated at higher frequency values, so that the measuring system can be faster than in the case of the $a'$ characteristic.

Since amplifiers exhibit a limit with respect to the product of the gain factor and the bandwidth, this means that the magnitude of the gain factor $K(a'')$ is subject to limits. However, as the ultimate measuring accuracy of the measuring system is determined by the magnitude of said gain factor, said measuring accuracy is also subject to a limit which is related to the required bandwidth of the amplifier.

Owing to the step according to the invention, said $a''$ characteristic for lower frequencies can be transformed to the $a'''$ characteristic. The final amplifier characteristic is then flat up to a frequency $f_1$, which for example corresponds to the break point of the a-characteristic, then has a slope of for example −6 dB/oct. up to a frequency $f_2$, which is lower than the frequency of the intersection with the $1/\beta$ ($V_o = 0.1$ V) characteristic, and then corresponds to the $a''$ characteristic. The advantage of said $a'''$ characteristic is that the low-frequency gain factor $K(a''')$ has increased so that the ultimate measuring accuracy of the measuring arrangement increases. The use of the $a'''$ characteristic ensures both a high measuring speed (points of intersection with the $1/\beta$ characteristics are situated at high frequencies) and a high measuring accuracy (high low-frequency gain factor).

Said $a'''$ characteristic can only be used in conjunction with the additional linear negative feedback because, in the case that said linear negative feedback is not provided, the family of $1/\beta$ characteristics will have no upper limitation. In that case there will be $1/\beta$ characteristics, as is illustrated by the $1/\beta$ ($V_o = 0.05$ V) characteristic, which intersect the $a'''$ characteristic in the falling portion. As the characteristics again intersect each other in said point of intersection at an angle of 12 dB/oct., the system would then be unstable.

It has been found that owing to said adaptation of the amplifier characteristic, the measuring time, which normally amounts to approx. 1 sec., can even be reduced to approx. 100 msecs., in which event it is obvious that specific requirements should be met in respect of the thermal behaviour of the thermal convertors. If a longer measuring time is employed for the final measuring result, to be on the safe side, it is possible to use said rapidly obtained measuring value for adaptation of the measuring range, for example for automatic measuring range selection.

It will be obvious to those skilled in the art that the scope of the invention is by no means limited to the embodiments shown in the Figures. For example, instead of the resistor-transistor configuration any arbitrary thermal converter may be employed. The linear negative feedback signal may, of course, readily be applied directly to the input of the differential amplifier A. Finally, to those skilled in the art, many modifications of the two negative feedback networks S will be apparent without departing from the concept underlying the invention, on which said networks are based.

What is claimed is:

1. A measuring arrangement for measuring the effective value of an electric a.c. signal comprising, a first energy dissipating element to which the a.c. signal is applied; a first temperature-sensitive element thermally coupled to said first energy dissipating element for converting the thermal energy produced by the first energy dissipating element into a first electric signal; a second energy dissipating element; a second temperature sensitive element thermally coupled to said second energy-dissipating element for converting the thermal energy produced by the second energy-dissipating element into a second electric signal; a differential amplifier with two inputs to which the first and the second electric signals are applied, and an output at which a d.c. output signal becomes available, means for applying the d.c. output signal to the second energy-dissipating element, a negative-feedback circuit responsive to the d.c. output signal for producing a negative feedback signal for values of the d.c. output signal smaller than a specific threshold value, said negative-feedback signal in the region around the zero value being linearly dependent on said d.c. output signal, and means for adding the negative feedback signal to at least one of the two electric signals supplied by the temperature-sensitive elements.

2. A measuring arrangement as claimed in claim 1, wherein the negative-feedback circuit includes first and second voltage-divider chains, each chain having a tapping terminal and a clamping circuit for clamping the output signal at the associated tapping terminal at a specific clamping value which is common to the two divider chains, the two voltage-divider chains being chosen so that the linear relationship between the output signals at the two tapping terminals and the d.c. output signal applied to the two voltage-divider chains is different, the difference of the two output signals being used as the negative feedback signal.

3. A measuring arrangement as claimed in claim 2 wherein the temperature-sensitive elements comprise two transistors connected as a differential pair, and means for applying the two output signals at the tapping terminals individually to the control electrodes of the two transistors.

4. A measuring arrangement as claimed in claim 1 wherein the negative-feedback circuit includes a voltage divider chain having a switching transistor and a tapping point from which the negative-feedback signal is taken, a comparator circuit which compares the value of the d.c. output signal with a reference signal which defines the threshold value, and means for coupling a switching signal derived in said comparator circuit to a control electrode of the switching transistor so that for values of the d.c. output signal smaller than said reference signal the switching transistor is made to conduct.

5. A measuring arrangement as claimed in claim 4 wherein said negative-feedback circuit includes circuit means for changing the reference signal between two different values, the first value being effective when the d.c. output signal is smaller than said first value, and the second value becoming effective if said first value is exceeded, said second value remaining effective as long as subsequently the d.c. output signal remains greater than said second value and being switched to the first value if the d.c. output signal becomes smaller than the second value.

6. A measuring arrangement as claimed in claim 5, characterized in that the second value of the reference signal is greater than the first value, and that the circuit means for changing the reference signal includes a switching network having a time constant which is greater than the time constant of the negative-feedback system.

7. A measuring arrangement as claimed in claim 1 characterized in that the transfer characteristic of the differential amplifier between a first and a second frequency limit has a constant frequency-independent gain value and below the first frequency limit has a portion with a negative slope, the first frequency limit having such a value that the reciprocal of the negative feedback factor which corresponds to said frequency at the threshold value of the d.c. output signal is smaller than said gain value, the second frequency limit having such a value that the reciprocal of the negative feedback factor corresponds to said frequency at the maximum permissible value of the d.c. output signal is greater than said gain value.

8. A measuring arrangement as claimed in claim 1 wherein said negative feedback circuit includes a source of reference signal that defines said threshold value and a switching element responsive to the d.c. output signal for disconnecting the negative feedback signal from said one electric signal when the amplitude of the d.c. output signal is related to said reference signal in a given ratio.

9. A measuring arrangement as claimed in claim 8 wherein said negative feedback circuit further comprises circuit means for changing the amplitude of the reference signal between first and second values as a function of the amplitude of the d.c. output signal.

10. A measuring arrangement as claimed in claim 9 wherein said circuit means comprises, a comparator having a first input coupled to receive the d.c. output signal, a second input coupled to receive the reference signal and an output coupled to a control electrode of the switching element, and switching means controlled by the output of the comparator and coupled to the second input of the comparator for changing the amplitude of the reference signal between said first and second values.

11. A measuring arrangement as claimed in claim 10 wherein the switching means includes a delay element chosen so that the time constant of the switching means is greater than the thermal time constant of the thermally coupled second energy-dissipating element and second temperature sensitive element.

12. Apparatus for measuring the effective value of an AC signal comprising, a pair of input terminals adapted to receive the AC signal, first and second thermoelements each exhibiting a non-linear response characteristic, means coupling the first thermoelement to said input terminals for deriving a first signal determined by the AC signal, an amplifier having first and second inputs and an output at which a DC output signal is produced, means coupling the second thermoelement to the output of said amplifier so that said second thermoelement derives a second signal determined by said DC output signal, means individually coupling said first and second thermoelements to said amplifier first and second inputs so as to form a negative feedback system, a negative feedback circuit responsive to the DC output signal for producing a DC negative feedback signal when the amplitude of the DC output signal is less than a given threshold signal value, said negative feedback signal varying linearly with the DC output signal in the region around the zero value thereof, and means for coupling said DC negative feedback signal to at least one input of said amplifier.

13. A measuring apparatus as claimed in claim 12 wherein the negative feedback circuit comprises circuit means having first and second feedback terminals and said linear negative feedback signal includes first and second linear feedback signals appearing respectively at said first and second feedback terminals and having different slopes but the same maximum amplitude value, and said feedback coupling means includes means for individually connecting said first and second feedback terminals to said amplifier first and second inputs, respectively.

14. A measuring apparatus as claimed in claim 13 wherein said first and second thermoelements comprise first and second transistors connected as a differential pair with their control electrodes individually coupled to said first and second feedback terminals as a part of said individual connecting means.

15. A measuring apparatus as claimed in claim 13 wherein said circuit means includes means for clamping the first and second feedback signals appearing at said first and second feedback terminals at the same voltage level, said voltage level being related to said given threshold signal value.

16. A measuring apparatus as claimed in claim 12 wherein the negative feedback circuit includes circuit means comprising, a feedback terminal for said negative feedback signal, means for comparing the DC output signal with a reference signal that defines said threshold value, and switching means controlled by the output of the comparison means for effectively coupling and decoupling the negativee feedback terminal and the one input of the amplifier as a function of the DC output signal.

17. A measuring apparatus as claimed in claim 16 wherein said circuit means further comprises second switching means controlled by the output of the comparison means for changing the amplitude of the reference signal between first and second levels as a function of the DC output signal.

18. A measuring apparatus as claimed in claim 17 wherein the second switching means includes a delay element providing a time constant for the second switching means which is greater than the thermal time constant of the second thermoelement.

* * * * *